Sept. 6, 1966 N. N. WINOGRADOFF ETAL 3,271,198

ELECTROLYTIC SEMICONDUCTOR PHOTOCELL

Filed Dec. 30, 1960

INVENTORS
NICHOLAS N. WINOGRADOFF
HERBERT K. KESSLER
BY
Sughrue, Rothwell, Mion & Zinn
ATTORNEYS United States Patent Office 3,271,198
Patented Sept. 6, 1966

3,271,198

ELECTROLYTIC SEMICONDUCTOR PHOTOCELL

Nicholas N. Winogradoff, Yorktown Heights, and Herbert K. Kessler, Mahopac, N.Y., assignors to International Business Machines Corporation, New York, N.Y., a corporation of New York Filed Dec. 30, 1960, Ser. No. 79,753
1 Claim. (Cl. 136—89)

The present invention relates to a novel photodetector which may be used as a reverse biased photodiode or as a photovoltaic cell, and which has no intrinsic limitation on the dimensions of the active surface.

Photovoltaic cells comprised of semiconductor material are well known in the prior art, as evidenced, for example, by the iron-selenium type photographic exposure meter. Such a cell needs no external power supply and develops a voltage across its terminals when illuminated by light having the proper frequency for that particular cell. Therefore, the cell acts as a self generator of E.M.F. upon exposure to light. Such cells may also be employed in circuit with a biasing voltage so as to vary the amount of current flow therethrough in accordance with the light falling thereon. Generally, such a photovoltaic cell consists of a region of semiconductor material making rectifying contact with metal, or it may consist of two regions of opposite type conductivity semiconductor materials forming a rectifying P-N junction therebetween. In these cells, a potential barrier exists at the junction area which prevents most of the majority carriers in one material, whether electrons or holes, to pass into the other material, and vice versa. Upon illumination of the barrier region by light having frequency components sufficiently great, some of the electrons in the valence band of the semiconductor material will receive enough energy so that they are excited or raised across the energy gap to the conduction band, leaving a hole, or a positive carrier, in the valence band. The barrier field separates the free carriers, which then tend to lower the barrier so that the Fermi level in the semiconductor is deformed, thus generating an E.M.F. between the cell terminals. A fuller explanation of the photovoltaic process in semiconductor cells may be found in the Handbook of Semiconductor Electronics, edited by Lloyd P. Hunter, McGraw-Hill Book Company, Incorporated, 1956, pages 5–9 through 5–14.

It follows from the above brief explanation that an efficient photovoltaic cell requires excess current carriers to be generated in or near the potential barrier regions of the junction so that they may be swept across the barrier and thus contribute to the generated E.M.F. However, two major factors limiting the performance of commercially available photodiodes and solar cells lie in the absorption of the incident light prior to its reaching the barrier area, together with the loss of carrier produced close to the surface by surface recombination processes. The above factors affect the spectral response of the cell and its sensitivity to light.

In semiconductor material, the depth of penetration of incident light thereon depends primarily on the degree of its absorption therein. The thicker the semiconductor material surrounding the barrier junction, therefore, the longer the path that the incident light must travel in order to create excess carriers in the region of the barrier, and a more likelihood that light of higher frequency will be absorbed by virtue of electron-hole carrier generation prior to its arrival at the barrier region. The probability is less than such carriers as are generated without the barrier region will be swept across same, and so it is seen that the generated E.M.F. or current may be substantially reduced as the frequency increases of the incident light. This limitation may be overcome by reducing the thickness of the semiconductor between the light source and junction field or by reducing the absorption coefficient in this portion of the device.

In the case of excess carriers formed near or on the surface of semiconductor material, these carriers are not necessarily swept to and over the barrier region because of the well known surface recombination phenomenon. Surface recombination is that process whereby excess electron-hole carriers caused by the absorption of light are easily recombined at the semiconductor surface due to so-called surface recombination centers or states in the crystal caused by surface roughness, irregularities and impurities. This recombination results in fewer excess carriers reaching the junction barrier or field, and thus reduces the generated E.M.F. In general, the surface recombination losses in conventional solar cells can be minimized by etching the semiconductor surface upon which falls the incident light, but where premature absorption and thus depth of penetration of light is enhanced by using very thin P- or N-type surface layers, the use of an etch after the formation of the surface layer is almost impossible. Thus, in the prior art type solar cell, it is not practical to minimize the effects of both absorption and surface recombination within the same cell, since the techniques employed are not compatible with each other.

It is therefore an object of the present invention to provide a novel photodiode wherein both the effects of premature light absorption and surface recombination are minimized, thus enhancing the photosensitivity and spectral response of the cell.

In accordance with the above object, a semiconductor electrolytic cell is provided wherein a surface potential barrier is established at the interface junction of a semiconductor and an optically transparent electrolyte, which allows incident light thereon to pass through the electrolyte without substantial absorption in order to create electron-hole pairs in the barrier region.

Another object of the present invention is to provide an improved solar cell wherein a semiconductor surface may be etched so as to minimize the effect of surface recombination.

A yet further object of the invention is to provide an improved solar cell wherein a semiconductor material is placed in contact with a liquid electrolyte solution so as to form a potential barrier therebetween, with the surface of said semiconductor at said contact being etched in order to minimize surface recombination of carriers generated at the barrier by the non-absorbing passage of light through the electrolyte.

It is another object of the invention to provide a photovoltaic cell in which the semiconductor material consists of silicon and the electrolyte consists of a solution of sulphuric acid.

Yet another object of the present invention is to provide a novel semiconductor-electrolytic cell whose photovoltaic characteristics may be modified by external biasing means.

These and other objects of the invention will be pointed out in the following description, which is to be taken in accompaniment with the drawings, in which.

Figure 1:
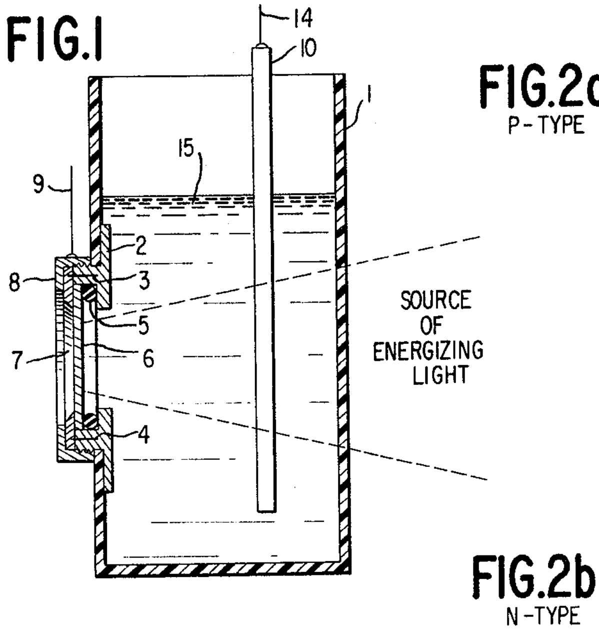
FIGURE 1 is a diagrammatic representation of the photovoltaic cell of the present invention.

FIGURE 1 shows the design of a typical photovoltaic cell of the present invention. This may comprise a clear plastic container 1, one side of which is perforated and fitted with a plastic collar 2. A rubber ring 5 is then fitted next to collar 2, with a wafer 6 of semiconductive material being compressed against ring 5 by a metal screw cap 8 which in turn bears onto a metal plate 7 making ohmic contact with wafer 6. Plate 7 may be prevented from rotating by means of two dowel pins 3 and 4 which project from collar 2 and engage plate 7 as shown in FIGURE 1. An electrical conductor 9 is ohmically connected to screw cap 8. Semiconductor wafer 6 therefore serves as one region or electrode of the photovoltaic cell.

Within container 1 is placed a rod 10 having an electrical conductor 14 ohmically attached thereto. Container 1 is filled with an electrolyte solution 15 which occupies at least the space between rod 10 and the inner surface of wafer 6. Rod 10 serves as an ohmic contact to the electrolyte. A potential barrier, or rectifying junction, is formed between water 6 and solution 15 at the interface surface between these two materials when they make physical contact with each other. Conductors 9 and 14 comprise the cell terminals across which appears the generated E.M.F.

The inner surface of the semiconductor wafer 6, that is, the surface making contact with the electrolyte 15, is treated so that the surface recombination of carriers therein will be minimized to the utmost degree. Such treatment may comprise, but is not necessarily limited to, a chemical etching process. Inasmuch as the semiconductor wafer 6 does not need to be extremely thin, the etching process, although removing some of the material, will not materially weaken the wafer. Futhermore, in one embodiment of the cell, the semiconductor wafer 6 may consist of silicon having either a P-type or an N-type conductivity, which is preferably, but not necessarily, in single crystal form. The semiconductor may be doped if desired, although this does not appear necessary. White etch, followed by a hydrofluoric acid treatment, may be used on the inner surface of the wafer. Other semiconductor materials besides silicon may also conceivably be employed in the cell of the present invention. The liquid electrolyte may be any of the following: a solution of sulphuric acid ($H_2SO_4$), HF in $H_2O$, or potassium hydroxide (KOH). A multitude of other similar electrolytes having an acid base, or neutral salt composition may be also used, as well as dipolar organic liquids. It is also noted that the liquid electrolyte can be replaced by a solid optically transparent conductor in contact with one surface of the semiconductor wafer, having a nature such that ionic changes or dipole layers may be adsorbed therefrom. The rod 10 which is immersed into the electrolyte making ohmic contact therewith so as to provide one terminal of the cell, should be an inert material such as platinum, paladium, or carbon, although it conceivably may be other than one of these three elements.

In the cell of FIGURE 1, one wall of container 1 (that opposite the semiconductor wafer 6) may be fitted with an optical window of material permitting the use of the cell in a spectral range not normally transmitted by the plastic walls. For example, the use of a quartz or sapphire window will enable the cell to respond to the ultraviolet regions of the spectrum. Furthermore, the contact to the extrnal surface of the semiconductor may be of ohmic or non-ohmic nature. Such contacts can be plated or alloyed, which in the latter case, would be such as to produce excess conductivity of the same type as that present in the semiconductor.

Figure 2A:
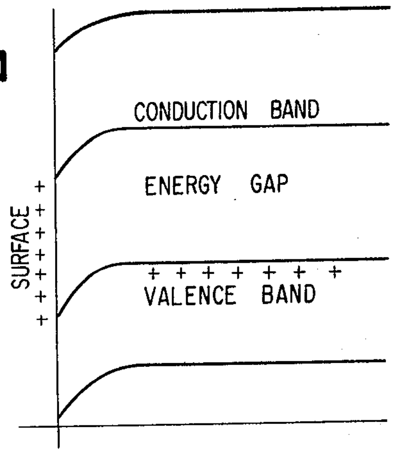
FIGURE 2 shows the bending of the semiconductor valence and conduction bands due to the surface barrier.
Figure 2B:
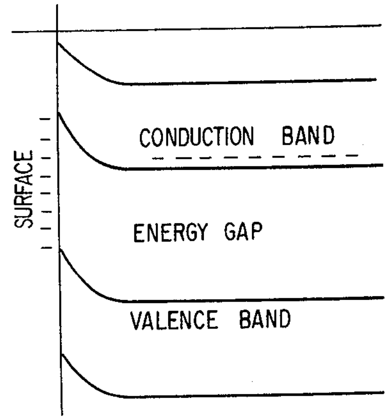

FIGURES 2*a* and 2*b* illustrate the surface barrier formed at the interface between the semiconductor wafer and the electrolyte when there is no illumination of this junction. One theory explaining this phenomena is that the surface states on the surface of the semiconductor adsorb ionic charges or dipole layers from the electrolyte (or solid conductor) and so produce a surface potential barrier just inside the semiconductor. This surface barrier results in the bending of the semiconductor valence and conduction bands downwards or upwards at the surface depending upon the conductivity type of the semiconductor and on the biasing voltage used, if any. For example, in FIGURE 2*a*, a layer of positive charges on the surface of the semiconductor creates a potential barrier to the holes in the valence band of the P-type semiconductor material which are the majority carriers. However, this barrier does not not oppose a very minute flow of minority carriers, i.e., electrons in the valence band. Conversely, when the semiconductor is of N-type conductivity as in FIGURE 2*b*, a layer of negative charges on the surface creates a potential barrier to the free electrons in the conduction band which are the majority carriers. It does not oppose a very minute flow of minority carriers, i.e., holes in the valence band. Illumination of the barrier region and generation of excess electron-hole pairs in the semiconductor thereby creates sufficient minority carriers which pass across the barrier and thus generates an E.M.F. at the terminals of the cell, and enables a current to flow through an external circuit connected to its terminals.

In operation, the energizing light is applied to the inner surface of semiconductor wafer 6 via a path through the transparent container 1 and electrolyte 15. Inasmuch as little or no light absorption is encountered in electrolyte 15, the vast majority of the photons are able to penetrate the semiconductor water at the barrier region wherein they are absorbed and generate the excess current carriers in the manner heretofore described. Current carriers are therefore produced close to and within said barrier region of the material where they may be easily swept to and across the potential barrier existing at the interface. Since surface recombination losses are quite small due to the etch or other treatment of the semiconductor material, most of the excess carriers drawn to the interface will not be recombined at this point and so will successfully traverse the barrier in order to contribute to the generated E.M.F. across the cell terminals. Thus, the two limiting factors of high frequency absorption and surface recombination are both substantially diminished by the novel construction of the present invention.

Figure 3:
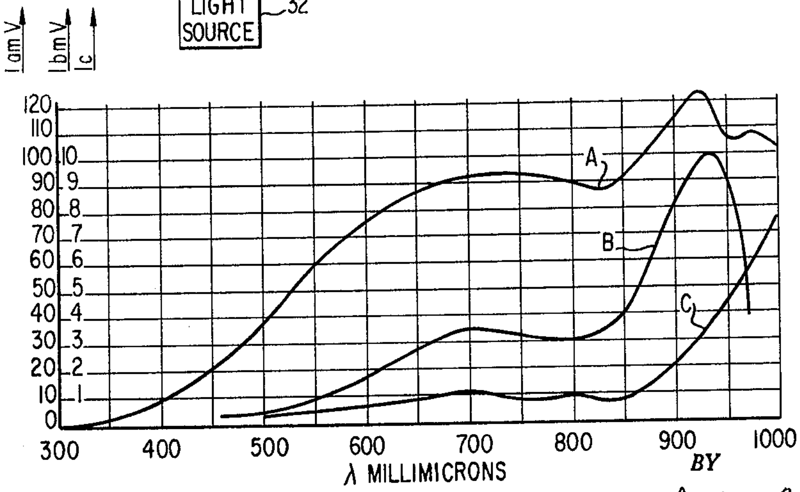
FIGURE 3 illustrates the spectral response curve of the improved solar cell with that of a conventional solar cell.

Referring now to FIGURE 3, the spectral response curves for the silicon-sulphuric acid-platinum solar cell of the present invention and for a conventional commercial silicon solar cell are shown. The spectral response curve for the present invention is shown by curve A where it is compared with the response obtained from a typical commercial silicon solar cell exposed to identical light intensities as indicated by curve B. The light intensities for each of these curves is shown by C. The abscissa of the chart is expressed in the wave length of the incident light as expressed in millimicrons, while the ordinate of the chart indicates the generated E.M.F. at the cell terminals. These curves show that the silicon-sulphuric acid-platinum cell produces much larger voltages for given illumination intensities than the commercial solar cell, and that its frequency response for equal intensities of light of different wave lengths shows an increased sensitivity toward the ultraviolet or high frequency part of the spectrum, i.e., towards the shorter wave lengths. However, the spectral response of the commercial solar cell rapidly decreases toward this part of the spectrum. These phenomena may be directly attributed to the minimizing of the surface recombination of excess carriers which thus allows more carriers to participate in the barrier diffusion process, and also to the absence of light absorption prior to its reaching the barrier region for higher frequency light intensities. Thus, the spectral response of the improved solar cell is greater in the ultra-violet region because the increased frequency of the light does not cause it to produce excess and non-productive carriers in the electrolyte solution before it actually reaches the barrier region around the semiconductor wafer.

Figure 4:
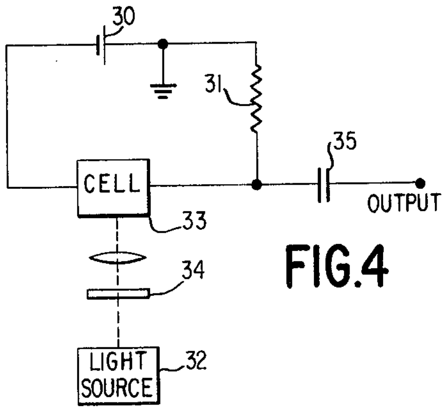
FIGURE 4 shows the cell of the invention in circuit with a biasing source which modifies its characteristics.

As noted in connection with FIGURE 2, the electrical and optical characteristics of the cell are governed by the height, depth of penetration, and direction of the field represented by the deformations of the conduction and valence bands within the semiconductor material. It follows, therefore, that these characteristics can be modified by applying biasing voltages, both forward and reverse, to the cell. This is an important and novel feature of the present invention. These voltages may cause more or less ions to be adsorbed in the semiconductor surface, and so enable the device to be used in a multitude of different ways, including use as rectifiers and large area photodiodes. Thus, the improved solar cell of the present invention may be connected in circuit with a load resistor 31 and a biasing source 30 as shown in FIGURE 4 so that it controls the amount of current flowing in said circuit in accordance with the frequency and intensity of illumination thereto. In general, the presence of two dissimilar electrodes (such as silicon and platinum in the above embodiment) in an electrolyte will produce a D.C. galvanic current which is superimposed on the above photocurrent. For some applications, this may impair the dark to light "resistance ratio" or sensitivity of the device. In such applications, the photocurrent may be resolved (or separated) from the D.C. galvanic current by using a chopped light beam (as may be generated by light chopper 34 in FIGURE 4), together with a capacitor 35 for A.C. coupling to the output terminal. For example, the cell has been used with reverse biasing voltages up to 300 volts. With typical operating reverse voltages of 160 volts, 145 volt signals were obtained with a $Pt/H_2SO_4/Si$ cell using a chopped light beam incident therein. Using low resistivity, doped, semiconductors, it is believed that the cells can be used as solar cells of very high efficiency. Response times (from zero to full amplitude) of better than 5 microseconds, and decay times (full amplitude to zero) of some 15 microseconds were quite common, when operated in the electrically saturated condition as determined by the magnitudes of the reverse biasing voltage and the incident light.

While a particular embodiment of the invention has been shown, it will be understood that the invention is not limited thereto since many modifications may be made, and it is, therefore, contemplated by the appended claim to cover any such modifications as fall within the true spirit and scope of the invention.

What is claimed is:

A semiconductor photovoltaic cell comprising:

containing means and an optically transparent solution of $H_2SO_4$ therein, an element comprising a region of single crystal silicon semiconductor material having two major surfaces, one of said surfaces being etched to substantially reduce recombination of carriers, said element being disposed in said containing means so that said etched surface is in contact with said electrolyte and forms therewith an interface across which exists a surface barrier field, and so that said etched surface is exposable to light transmitted through said electrolyte thereto, inert platinum electrode in ohmic contact with said electrolyte, and an electrical contact in ohmic contact with said other surface of said semiconductor, said electrode and electrical contact serving as the cell terminals.

References Cited by the Examiner

UNITED STATES PATENTS

| | | | |
|---|---|---|---|
| 1,941,493 | 1/1934 | Ruben | 136—89 |
| 1,941,494 | 1/1934 | Ruben | 136—89 |
| 2,572,079 | 10/1951 | Von Hippel et al. | 136—89 |
| 2,846,346 | 8/1958 | Bradley | 136—89 |
| 2,870,344 | 1/1959 | Brattain et al. | 136—89 |

OTHER REFERENCES

Bell System Technical Journal, vol. 35, March 1956, pp. 333–340.

Handbook of Semiconductor Electronics, by Lloyd P. Hunter, McGraw-Hill Book Company Inc. Published 1956.

WINSTON A. DOUGLAS, *Primary Examiner.*

JOHN H. MACK, JOHN R. SPECK, *Examiners.*

J. BARNEY, D. L. WALTON, A. M. BEKELMAN, *Assistant Examiners.*